United States Patent
Cheng et al.

(10) Patent No.: US 7,229,877 B2
(45) Date of Patent: Jun. 12, 2007

(54) TRENCH CAPACITOR WITH HYBRID SURFACE ORIENTATION SUBSTRATE

(75) Inventors: Kangguo Cheng, Beacon, NY (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 10/904,583

(22) Filed: Nov. 17, 2004

(65) Prior Publication Data

US 2006/0105536 A1    May 18, 2006

(51) Int. Cl.
*H01L 21/8242* (2006.01)
(52) U.S. Cl. .................. 438/241; 438/245; 257/E21.651
(58) Field of Classification Search ................ 438/241, 438/244, 245, 387, 388, 982; 257/E21.651
See application file for complete search history.

(56) References Cited

U.S. PATENT DOCUMENTS 6,037,208 A * 3/2000 Wei ............................ 438/243
6,544,837 B1 * 4/2003 Divakauni et al. ......... 438/243
6,555,891 B1   4/2003 Furukawa et al.
6,635,543 B2  10/2003 Furukawa et al.
2004/0002233 A1  1/2004 Advocate, Jr. et al.

OTHER PUBLICATIONS

Yang, M. et al., "High Performance CMOS Fabricated on Hybrid Substrate With Different Crystal Orientations," IEEE International Electron Devices Meeting, Dec. 8-10, 2003.

* cited by examiner

*Primary Examiner*—Chandra Chaudhari
(74) *Attorney, Agent, or Firm*—Lisa A. Jaklitsch; Hoffman, Warnick & D'Alessandro LLC

(57) ABSTRACT

Methods of forming a deep trench capacitor memory device and logic devices on a single chip with hybrid surface orientation. The methods allow for fabrication of a system-on-chip (SoC) with enhanced performance including n-type complementary metal oxide semiconductor (CMOS) device SOI arrays and logic transistors on (100) surface orientation silicon, and p-type CMOS logic transistors on (110) surface orientation silicon. In addition, the method fabricates a silicon substrate trench capacitor within a hybrid surface orientation SOI and bulk substrate. Cost-savings is realized in that the array mask open and patterning for silicon epitaxial growth is accomplished in the same step and with the same mask.

15 Claims, 15 Drawing Sheets

TRENCH CAPACITOR WITH HYBRID SURFACE ORIENTATION SUBSTRATE

TECHNICAL FIELD

The present invention relates generally to semiconductor device fabrication, and more particularly, to methods of forming semiconductor devices on a hybrid surface orientation and a structure so formed.

RELATED ART

Performance improvement of semiconductor devices is a never-ending endeavor for manufacturers of those devices. One challenge currently faced by the semiconductor industry is implementing memory and logic devices on a single chip while maintaining process simplicity and transistor performance. These devices are referred to as "system-on-chips" (SoC) because the electronics for a complete, working product are contained on a single chip. One approach that is currently employed to improve performance of a SoC is to fabricate the different types of logic devices on silicon substrates having optimal surface orientations. As used herein, "surface orientation" refers to the crystallographic structure or periodic arrangement of silicon atoms on the surface of a wafer. In particular, an nFET can be optimized by being generated on silicon having a (100) surface orientation, while a pFET can be optimized by being generated on silicon having a (110) surface orientation. In addition, memory devices and n-type field effect transistors (nFETs) are typically optimized when generated on silicon-on-insulator (SOI) substrates, while p-type FETS (pFETs) are typically optimized when generated on bulk silicon.

In addition to the above challenges, fabricating the above hybrid orientation logic devices and memory devices (e.g., a silicon deep trench capacitor used for dynamic random access memory (DRAM)) together presents additional challenges. In particular, deep trench capacitor memory devices typically require different masks for opening a deep trench for the capacitor and for patterning for silicon epitaxial growth for the pFET logic devices, which adds expense. In addition, memory devices may also have optimal substrate requirements. For example, memory devices are typically optimized when generated on SOI substrates, similar to nFETs.

In view of the foregoing, fabrication of memory devices and the different types of logic devices while maintaining performance is difficult. There is a need in the art for improved methods of fabricating memory and logic devices on a single chip with hybrid surface orientation.

SUMMARY OF THE INVENTION

The invention includes methods of forming a deep trench capacitor memory device and logic devices on a single chip with hybrid surface orientation. The methods allow for fabrication of a system-on-chip (SoC) with enhanced performance including n-type complementary metal oxide semiconductor (CMOS) device SOI arrays and logic transistors on (100) surface orientation silicon, and p-type CMOS logic transistors on (110) surface orientation silicon. In addition, the method fabricates a silicon substrate trench capacitor within a hybrid surface orientation SOI and bulk substrate. Cost-savings is realized in that the array mask open and patterning for silicon epitaxial growth is accomplished in the same step and with the same mask.

A first aspect of the invention is directed to a method of forming a deep trench capacitor memory device and logic devices on a single chip with hybrid surface orientation, the method comprising the steps of: providing a bulk silicon substrate having a first surface orientation and a silicon-on-insulator (SOI) region thereon having a second, different surface orientation; forming a first and a second opening through the SOI region to the bulk silicon substrate using a hard mask; forming a spacer in each opening; forming a dielectric capped epitaxially grown silicon in the second opening; opening a deep trench into the bulk silicon substrate through the first opening; forming the deep trench capacitor in the deep trench; forming shallow trench isolations; and forming the logic devices.

A second aspect includes a method of preparing a substrate for forming a deep trench capacitor memory device and logic devices on a single chip with hybrid surface orientation, the method comprising the steps of: providing a bulk silicon substrate having a first surface orientation and a silicon-on-insulator (SOI) region thereon having a second, different surface orientation; using a single hard mask for forming: a first opening through the SOI region to be used for fabricating the deep trench capacitor, and a second opening through the SOI region to the bulk silicon substrate for fabricating a first type logic device on the first surface orientation.

A third aspect of the invention is directed to an electronic structure comprising: a bulk silicon substrate having a first surface orientation and a silicon-on-insulator (SOI) region thereon having a second, different surface orientation; and an electronic device vertically positioned partially within the SOI region and partially within the bulk silicon substrate.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
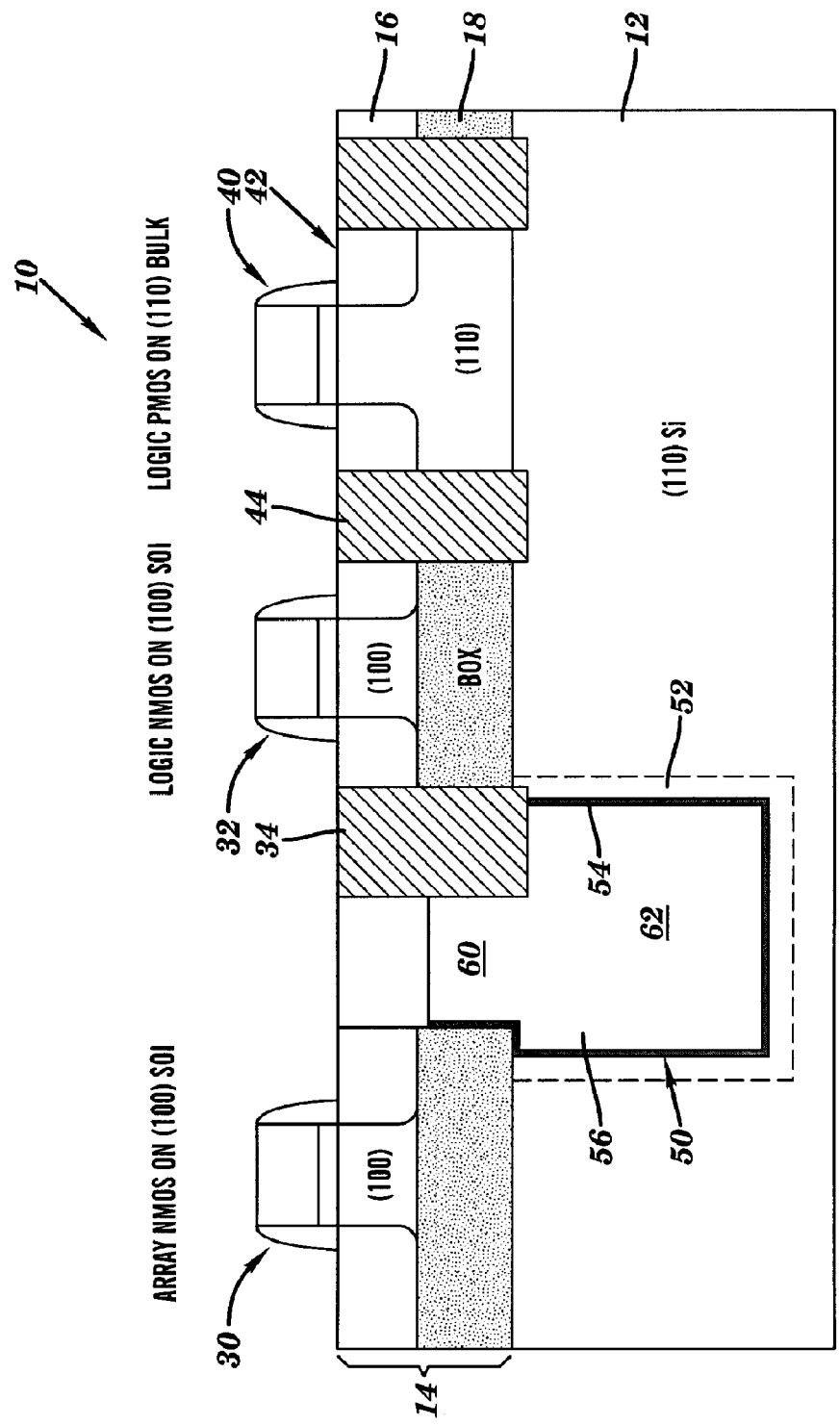
FIG. 1 shows an electronic structure formed according to one embodiment of the invention.

With reference to the accompanying drawings, FIG. 1 illustrates a system-on-chip electronic structure 10 having a deep trench capacitor memory device and logic devices on a single chip with hybrid surface orientation, which is fabricated according to one embodiment of a method according to the invention. Structure 10 includes a bulk silicon underlying substrate 12 having a first surface orientation, e.g., (110), and a silicon-on-insulator (SOI) region 14 thereon having a second, different surface orientation, e.g., (100). SOI region 14 includes a silicon layer 16 on a buried silicon dioxide (BOX) 18. An nFET array 30 is positioned on one part of SOI region 14 separated from a first type logic device 32 (e.g., nFET) on another part of SOI region 14 by a shallow trench isolation (STI) 34. Accordingly, both nFET array 30 and first logic device 32 are positioned on the second surface orientation, e.g., (100), of SOI 12. First type logic device (nFET) 32 is separated from a second type logic device 40, e.g., pFET, by another STI 44. Second type logic device 40 is positioned on an epitaxial silicon region 42 extending through SOI region 14 to bulk silicon substrate 12. Epitaxial silicon region 42 has the first surface orientation, e.g., (110), of bulk silicon substrate 12.

Structure 10 also includes an electronic device 50, which will be described herein as a deep trench capacitor, although it could be other devices such as gain memory cells, non-planar MOSFET transistors, FINFETS, bipolar transistor devices, Static Random Access Memory (SRAM) cells, flash memory, passive electronic elements such as resistors, capacitors, fuses, diodes and electrostatic protection devices, and latchup protection devices. As a trench capacitor, electronic device 50 includes a doped, buried plate 52, a node dielectric 54 surrounding a typically doped polysilicon filled trench region 56. Trench capacitor 50 is vertically positioned partially within SOI region 14 and partially within bulk silicon substrate 12, and is electrically separated from SOI region 14 by STI 34. Trench capacitor 50 also includes an upper portion 60 adjacent SOI region 14, and a lower portion 62 that is (optionally) wider than upper portion 60 positioned. Lower portion 62 is positioned below buried silicon dioxide 18 of SOI region 14. Buried plate 52 surrounds lower portion 62.

Figure 2:
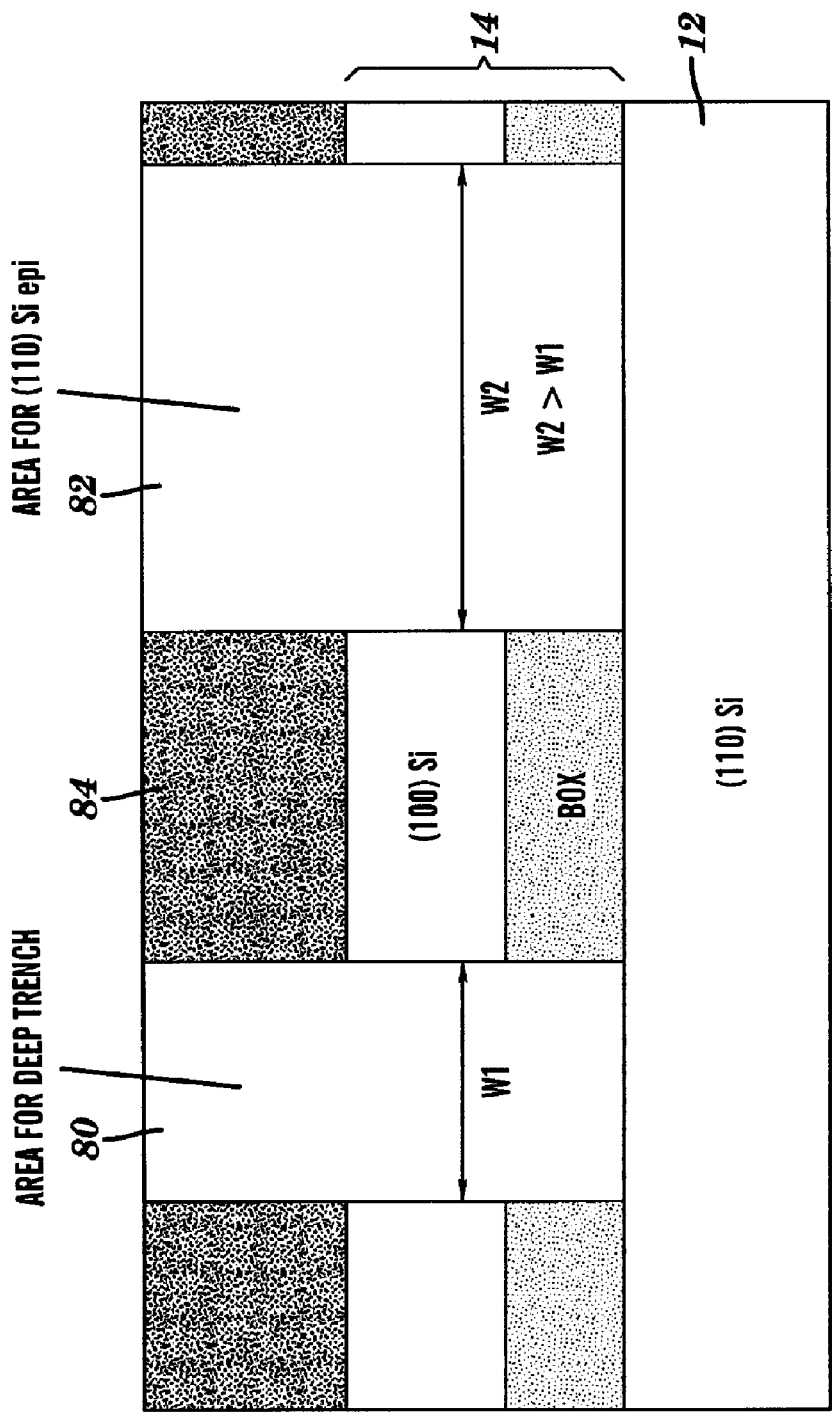
FIGS. 2–10 show steps of one embodiment of a method for forming the electronic structure of FIG. 1.

Referring to FIGS. 2–9, one embodiment of a method of forming structure 10 will now be described. FIG. 2 illustrates a number of steps including a first step in which a bulk silicon substrate 12 is provided having a first surface orientation, e.g., (110), and a silicon-on-insulator (SOI) region 14 thereon is provided having a second, different surface orientation, e.g., (100).

FIG. 2 also illustrates forming a first opening 80 and a second opening 82 through SOI region 14 to bulk silicon substrate 12 using a hard mask 84, i.e., pattern, dry etching. First opening 80 will be used for forming deep trench capacitor 18 (FIG. 1), and second opening 82 will be used for forming epitaxial silicon region 42 (FIG. 1) upon which is ultimately formed a logic device 40 (FIG. 1), as will be described below. Accordingly, a single hard mask 84 is used to form first opening 80 through SOI region 14 to be used for fabricating deep trench capacitor 50, and second opening 82 through SOI region 14 to bulk silicon substrate 12 for fabricating a logic device 40 on the first surface orientation, e.g., (110). Hard mask 84 may include, for example, silicon nitride or any other conventional hard mask material. As also shown, first opening 80 may have a width W1 that is not as wide as second opening 82, which has a width W2, i.e., W2>W1.

Figure 3:
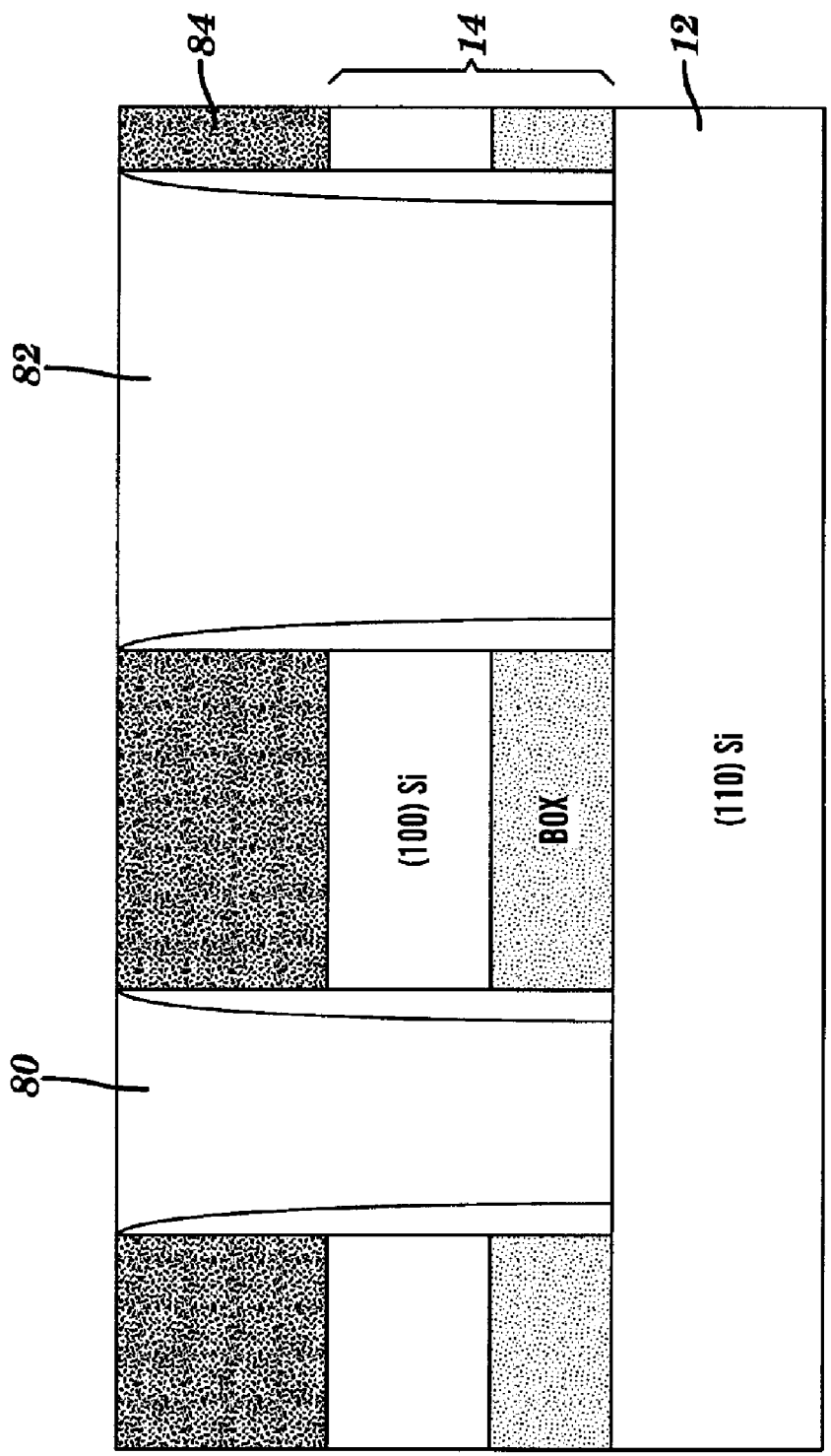
Figure 4A:
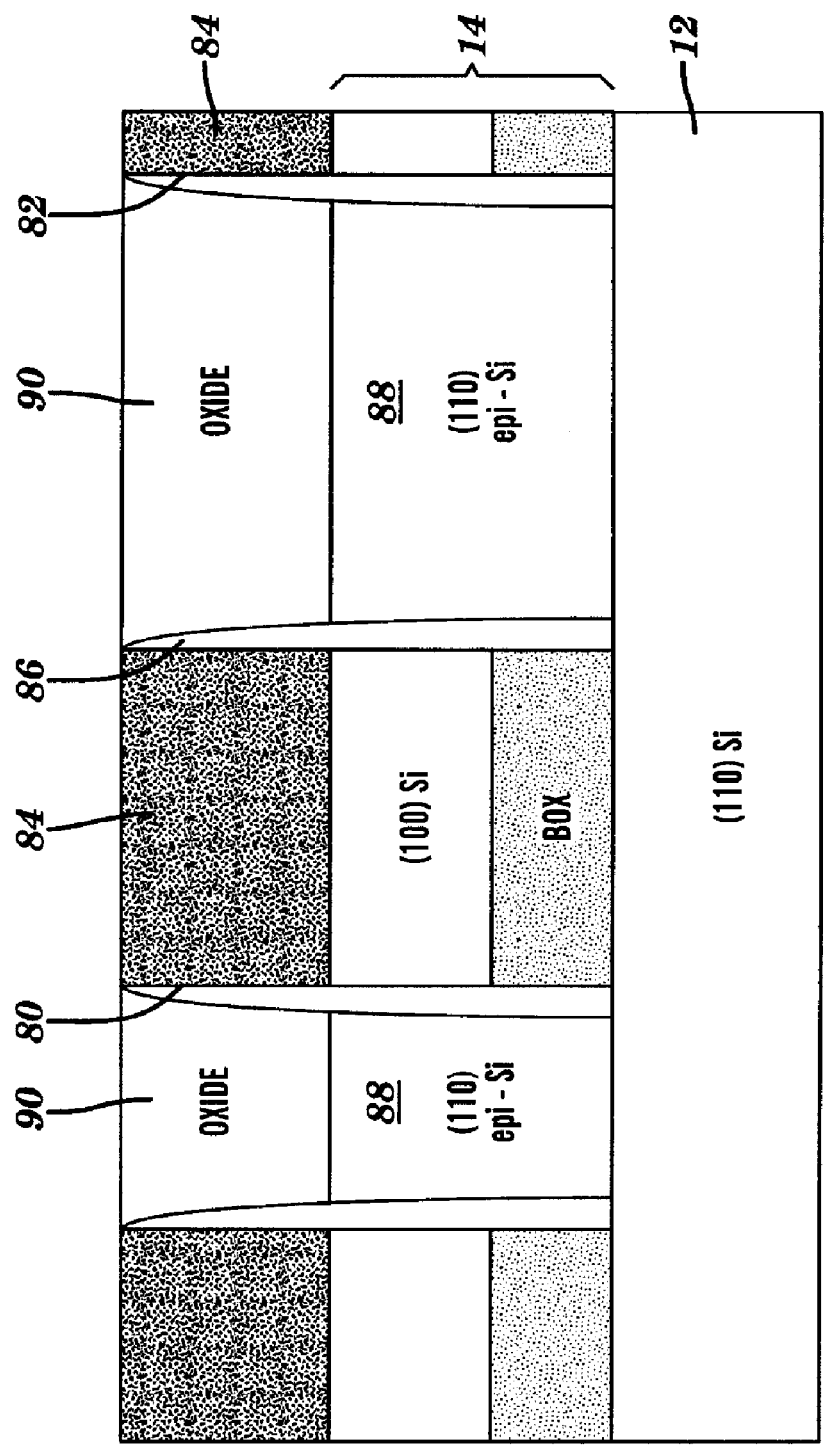

FIGS. 3 and 4A show a next step in which a spacer 86 (FIG. 4A) is formed in each opening. Spacer 86 (FIG. 4A) may be formed by any now known or later developed fashion such as thin conformal deposition such as low pressure chemical vapor deposition (LPCVD) followed by an anisotropic etch. Spacer 86 (FIG. 4A) may include, for example, silicon nitride or any other conventional spacer material. In one embodiment, spacer 86 has a thickness that is less than one-third of the diameter W1 (FIG. 2) of first opening 80.

Figure 4B:
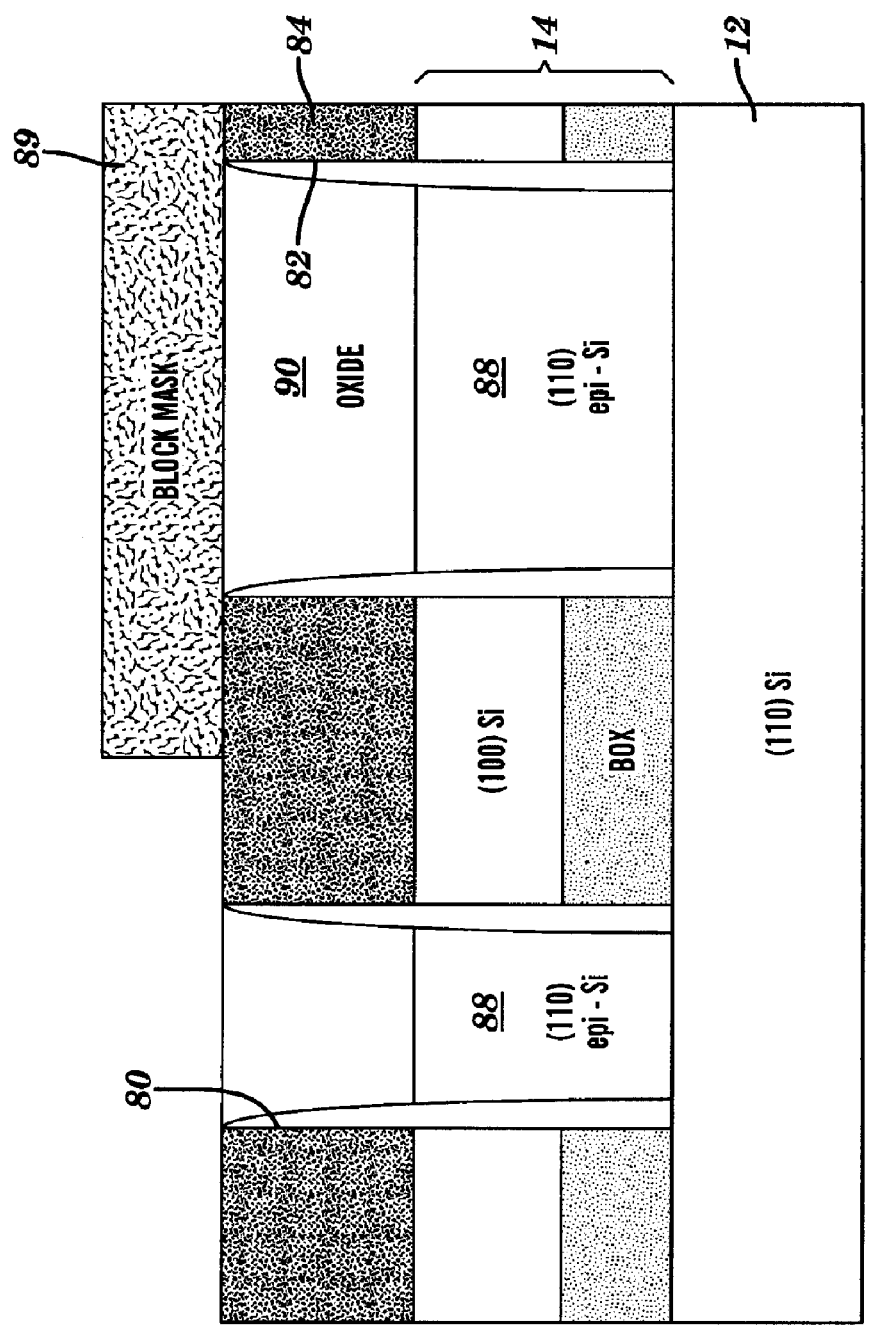

FIGS. 4A–4B and FIGS. 5A–5E illustrate two alternative embodiments for forming a dielectric capped epitaxially grown silicon in second opening 82. Referring to the first embodiment shown in FIGS. 4A–4B: A first step, shown in FIG. 4A, includes epitaxially growing silicon 88 in each opening 80, 82 such that epitaxial silicon 88 has the first surface orientation, e.g., (110). Next, as also shown in FIG. 4A, a dielectric cap 90 is formed over epitaxial silicon 88 in each opening 80, 82, and planarized by chemical mechanical polishing (CMP). This step may include, for example, planarizing and recessing epitaxial silicon 88 in each opening 80, 82 (e.g., by a wet chemical etch or dry etch such as sulfur hexaflouride ($SF_6$)), depositing dielectric 90 (e.g., by LPCVD) and then planarizing again. In one embodiment, dielectric cap 90 may include silicon dioxide. However, this is not necessary. Finally, as shown in FIG. 4B, dielectric cap 90 is removed from in first opening 80 to epitaxial silicon 88 using a block mask 89 of, for example, silicon carbide (SiC), silicon nitride ($Si_3N_4$) or other organic mask material.

Figure 5A:
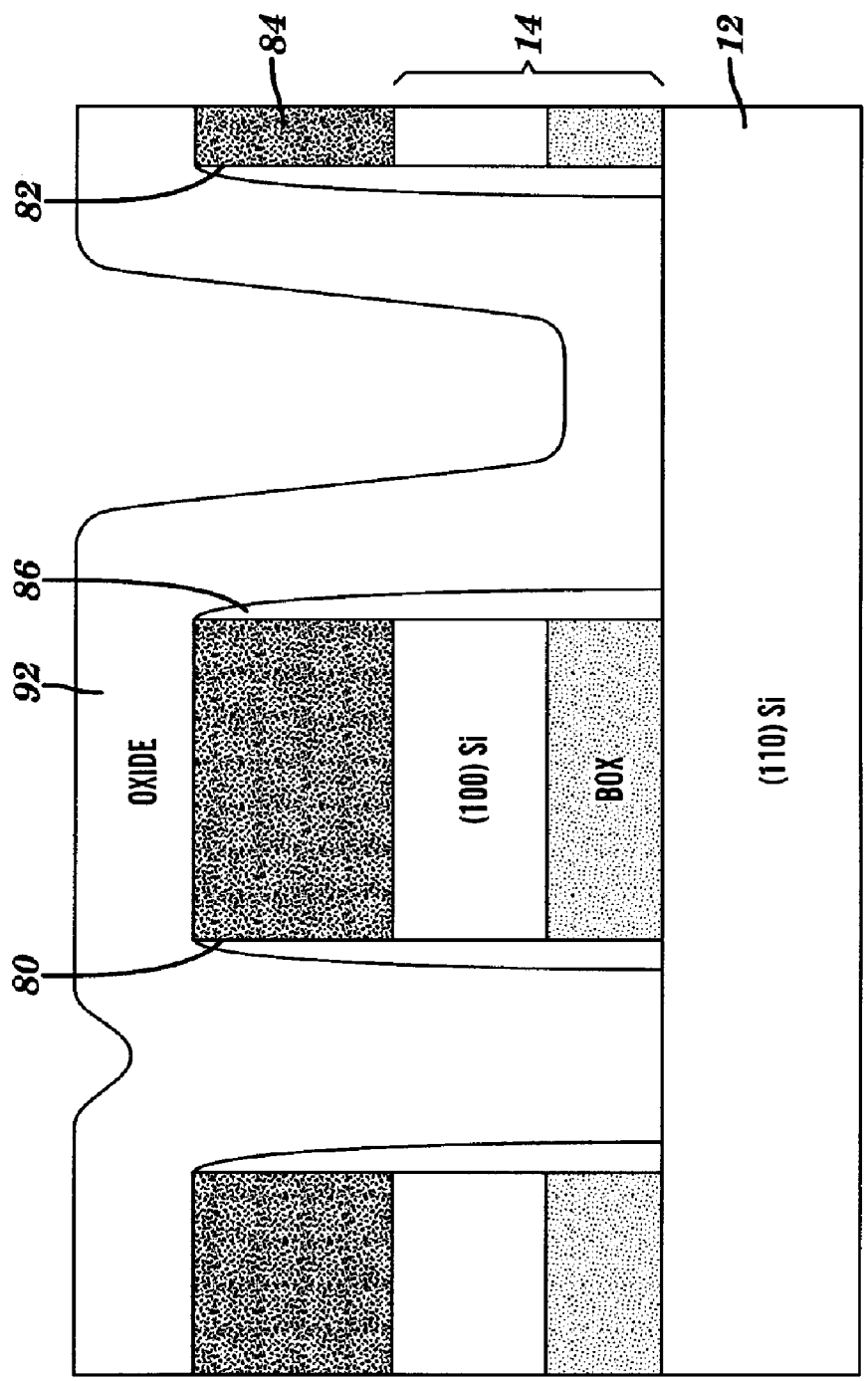
Figure 5B:
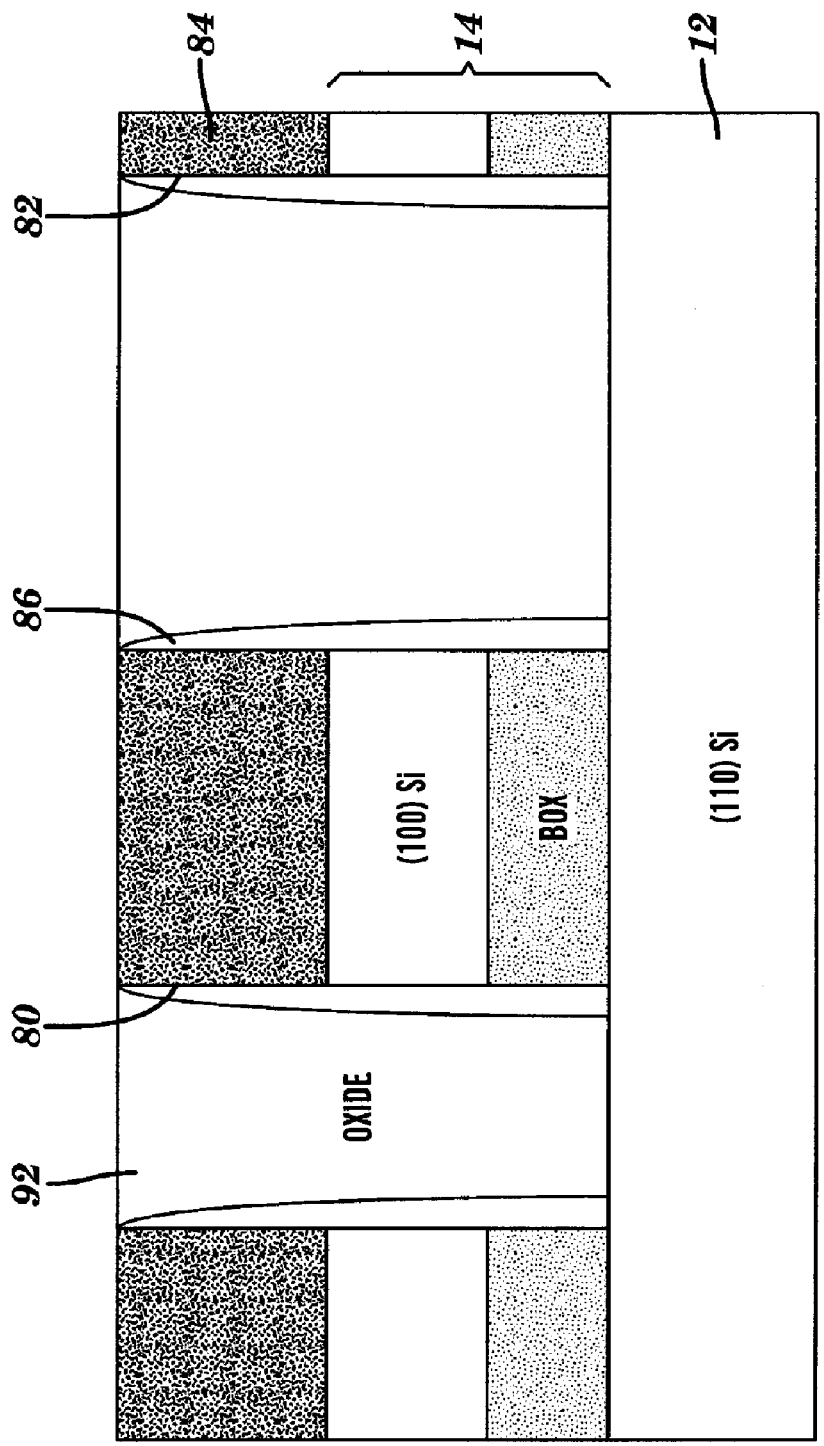
Figure 5C:
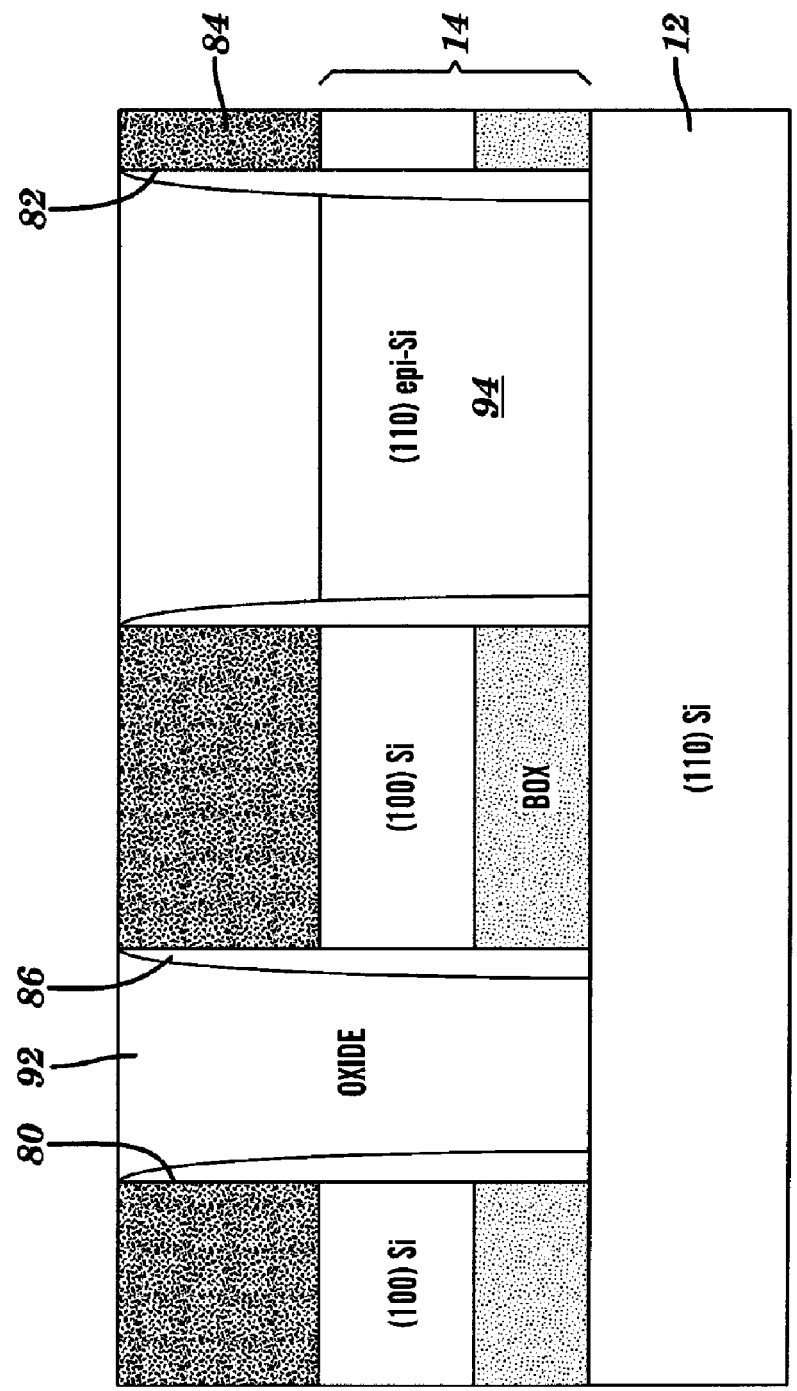
Figure 5D:
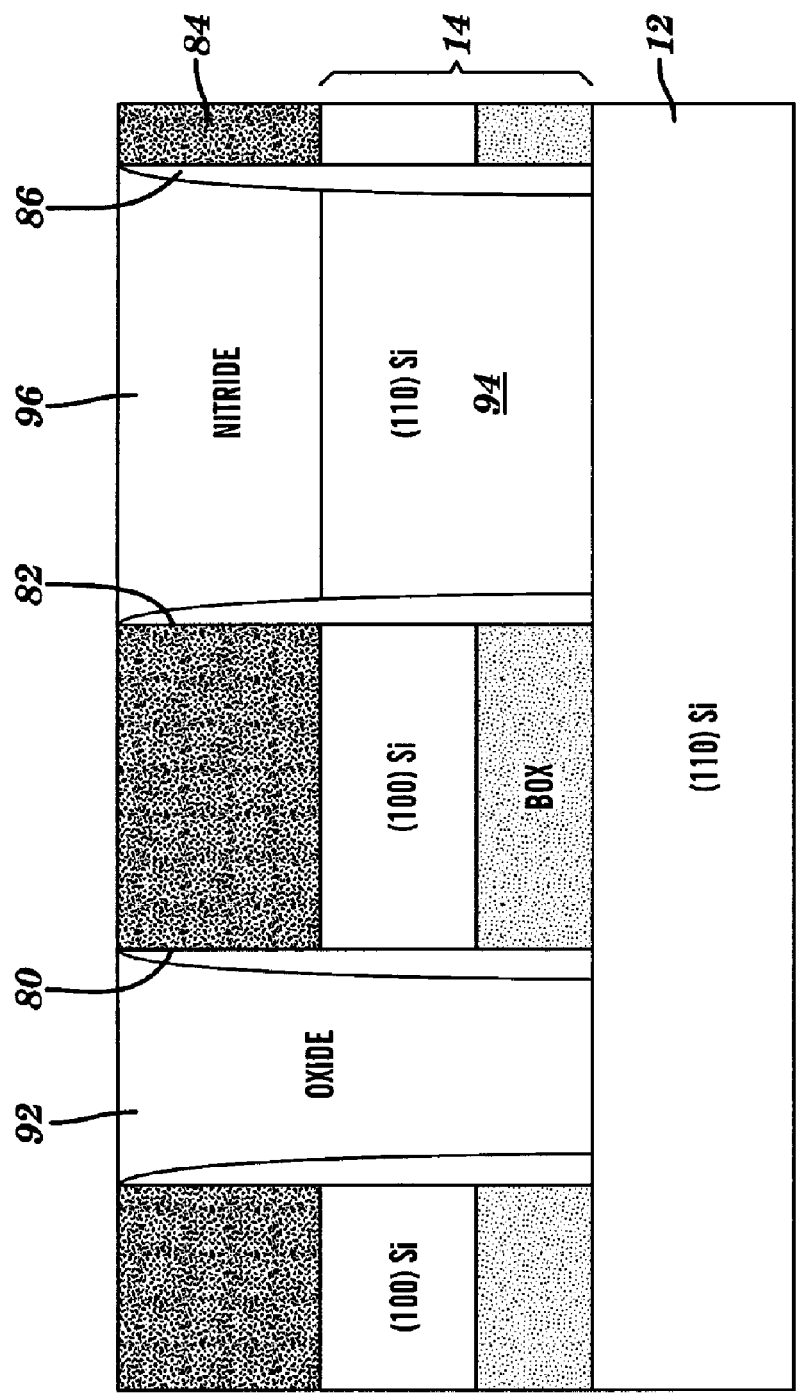
Figure 5E:
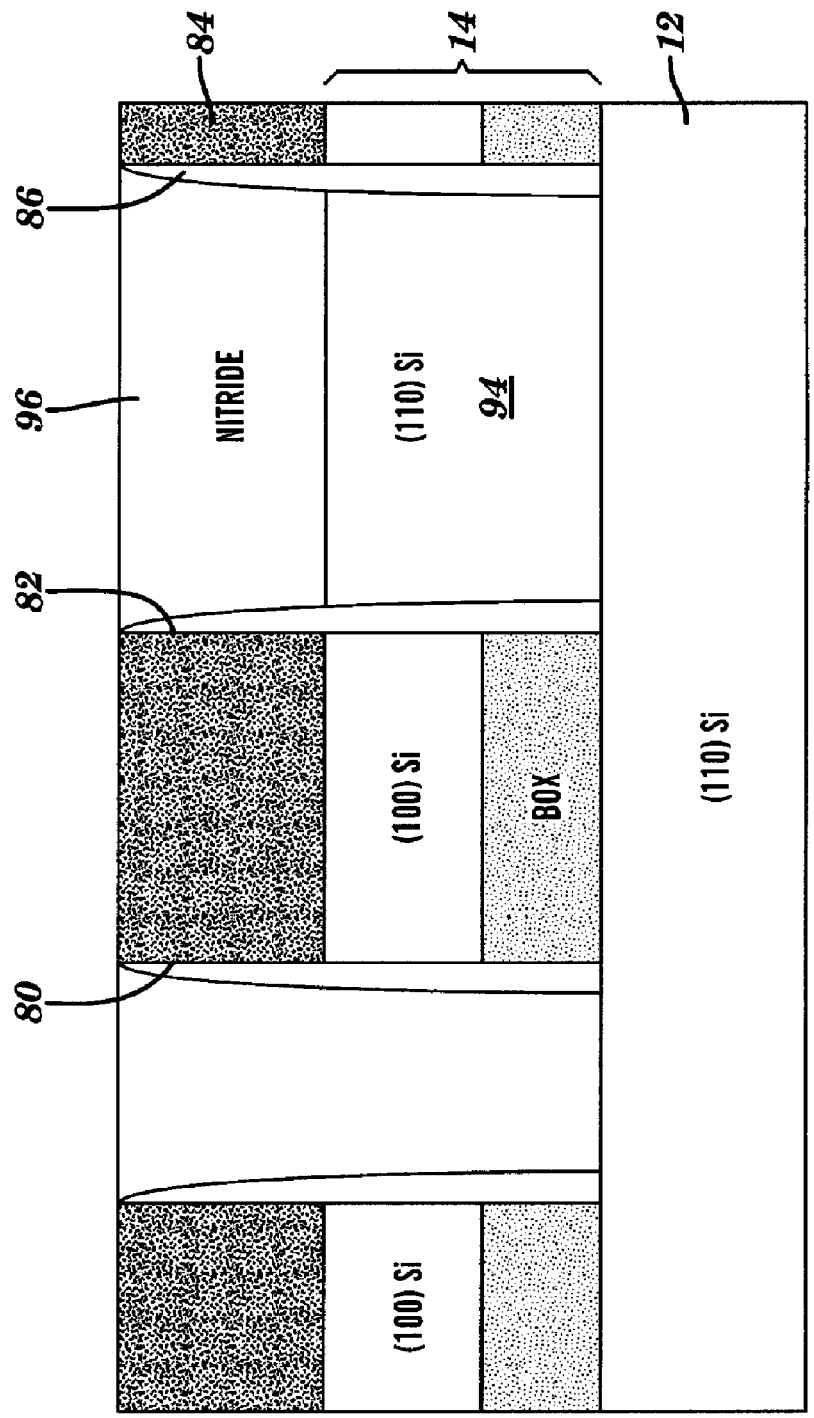

The second embodiment for forming a dielectric capped epitaxially grown silicon in second opening 82 includes: First, as shown in FIG. 5A, conformally depositing a first dielectric 92 to substantially fill first opening 80 and partially fill second opening 82. This occurs where first opening 80 has a width W1 that is not as wide as second opening 82, which has a width W2, i.e., W2>W1. In one embodiment, first dielectric 92 is silicon dioxide. However, other conformal dielectrics may also be used. Next, as shown in FIG. 5B, first dielectric 92 is removed from second opening 82. As shown in FIG. 5C, epitaxially growing silicon 94 in second opening 82 such that epitaxial silicon 94 has the first surface orientation, e.g., (110), is next. A second dielectric cap 96 is then formed over epitaxial silicon 94 in second opening 82, as shown in FIG. 5D. Second dielectric may include silicon nitride. However, this is not necessary. Finally, as shown in FIG. 5E, first dielectric 92 is removed from first opening 80.

Figure 6:
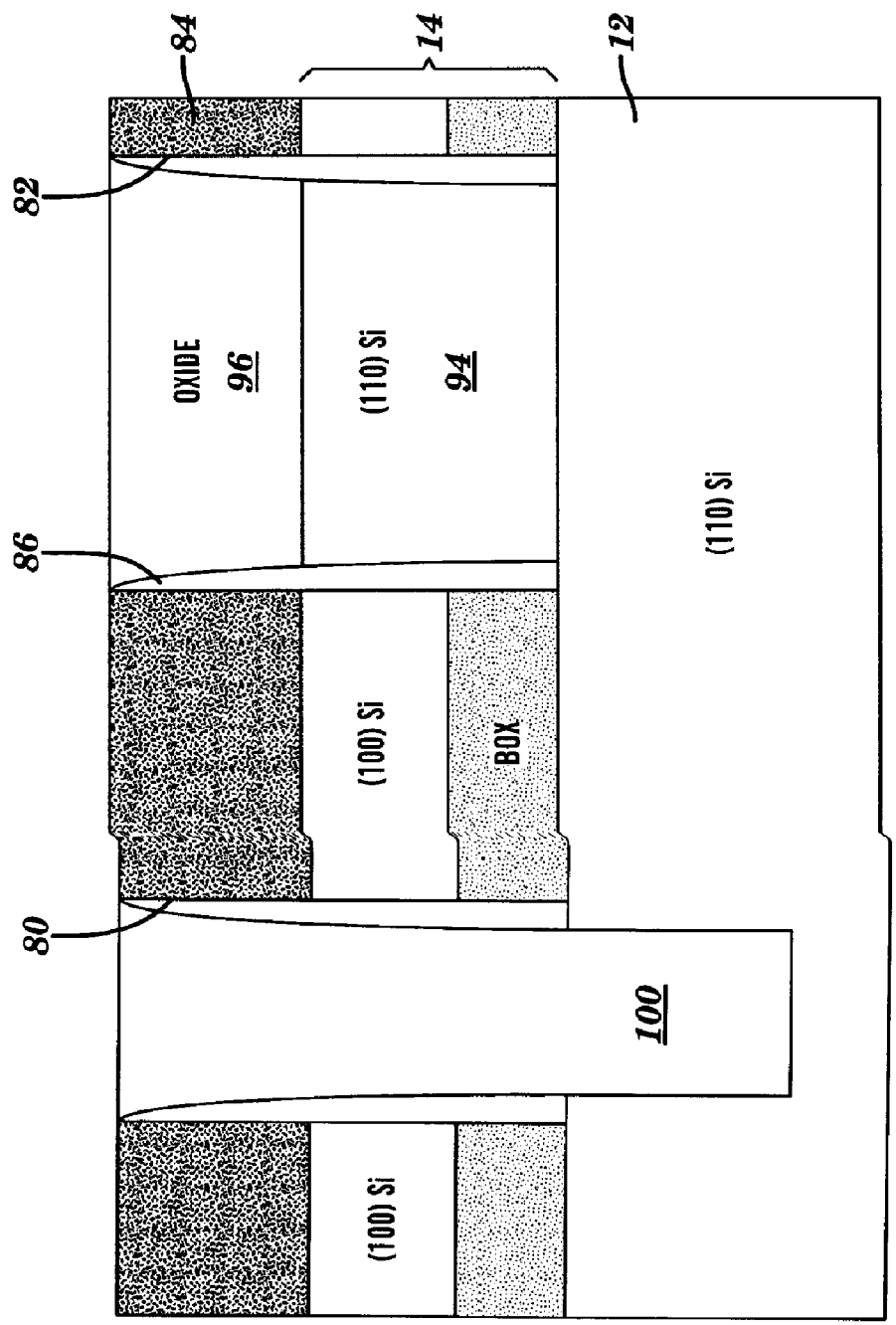

Next, as shown in FIG. 6, opening a deep trench 100 into bulk silicon substrate 12 through first opening 80 is conducted. If the FIGS. 4A–B embodiment is used, this step includes opening deep trench 100 through epitaxial silicon 88 (FIG. 4B) remaining in first opening 80 after removal of dielectric 90 (FIG. 4A). Block mask 89 (FIG. 4B) may be removed, as shown in FIG. 6, or it may be left in place and a highly selective anisotropic dry etch (e.g., chlorine (Cl), HBR, silicon tetrachloride ($SiCl_4$) containing a dry etch feed gas) used to pattern deep trench 100.

Figure 7:
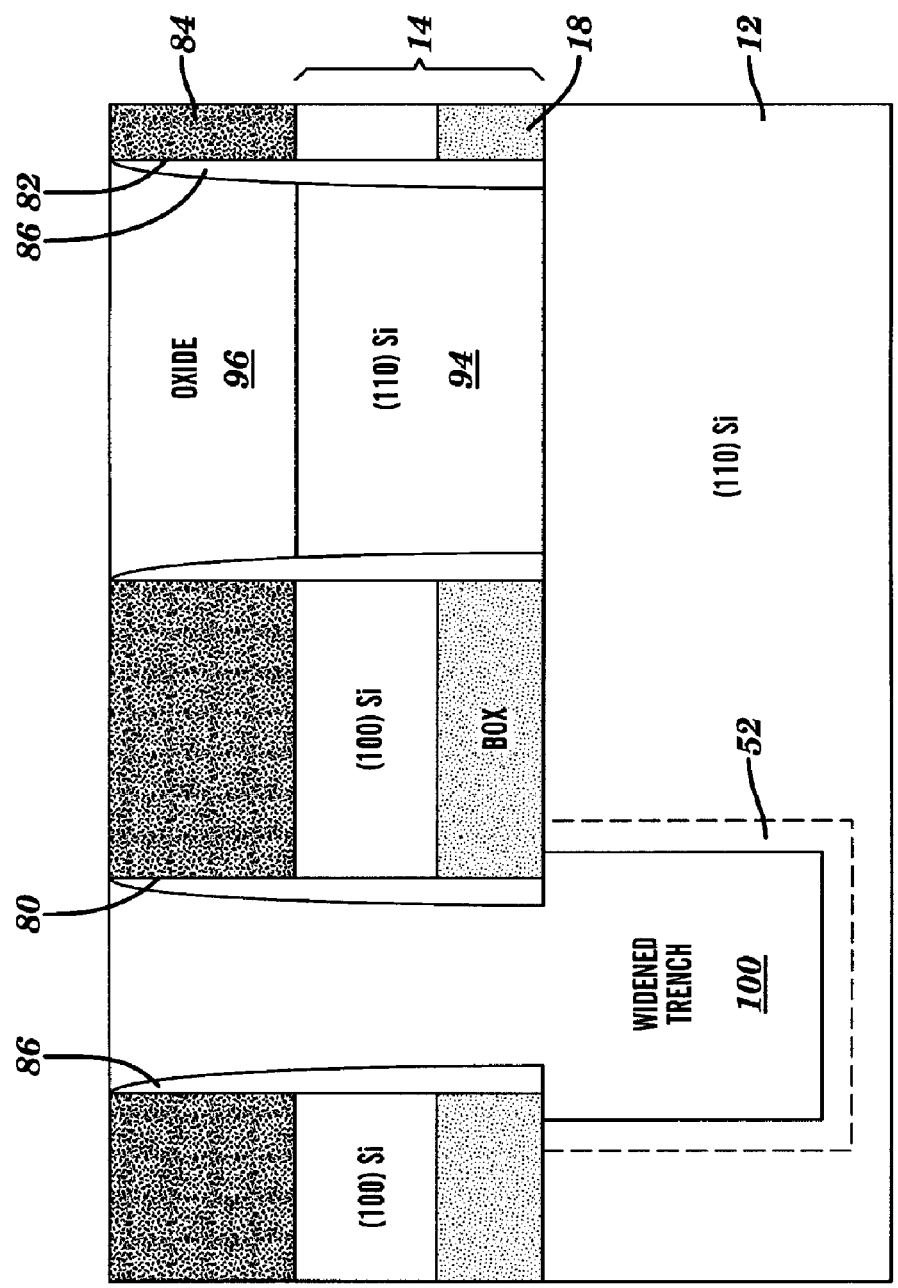

FIG. 7 illustrates an optional step of widening deep trench 100 in bulk silicon substrate 12 and below SOI region 14, i.e., below buried silicon dioxide 18, to increase a storage capacitance of capacitor 50 (FIG. 1) using, for example, an isotropic silicon etch. In addition, this step may include forming buried plate 52 in widened deep trench 100 to enhance trench capacitance. Buried plate 52 may be formed, for example, by diffusion in an arsenic (As) containing gas, or deposition of an As containing thin film and diffusion followed by a wet stripping. Spacer 86 protects SOI region 14 during the above processing, and can be removed thereafter from first opening 80.

Figure 8:
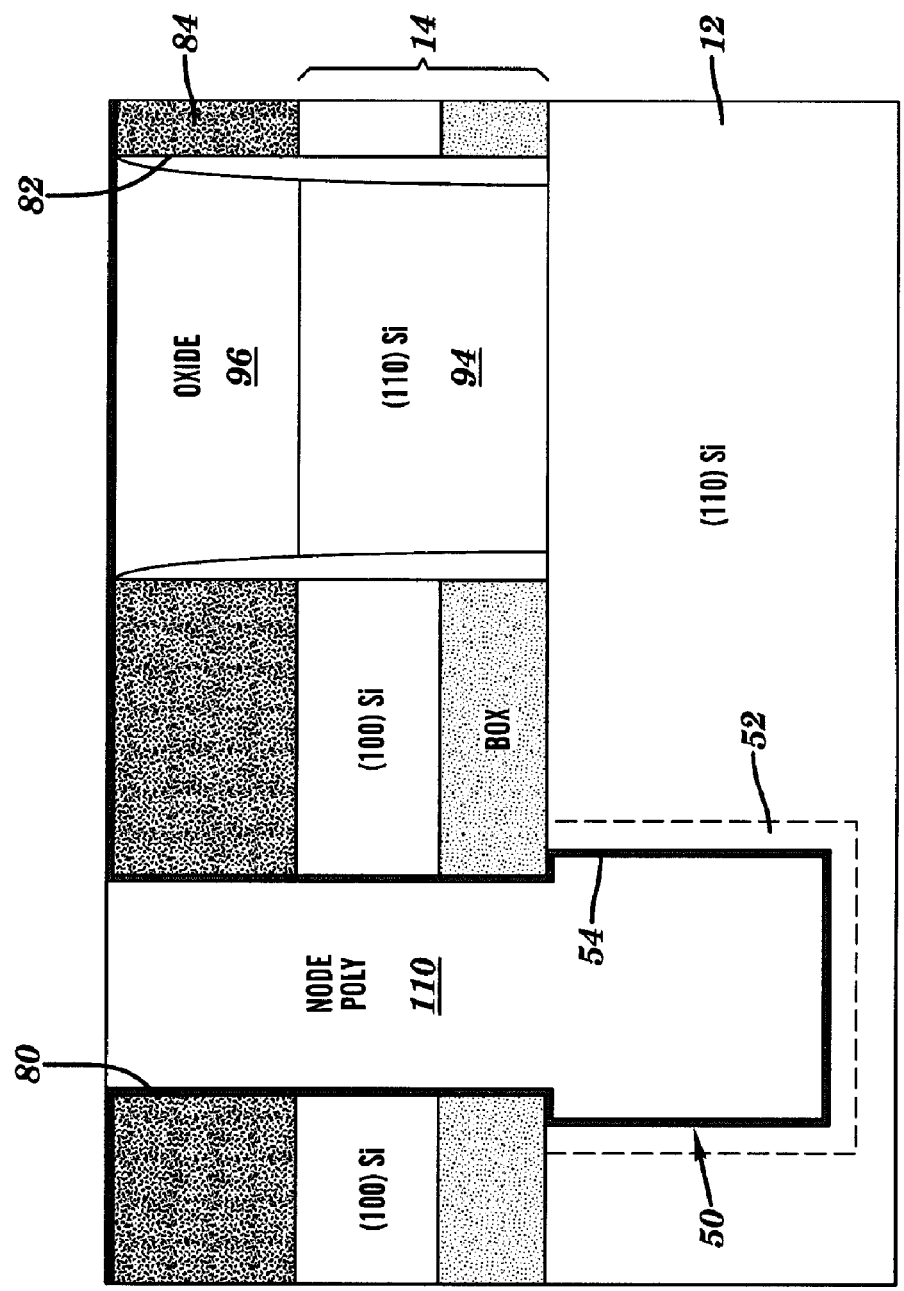
Figure 9:
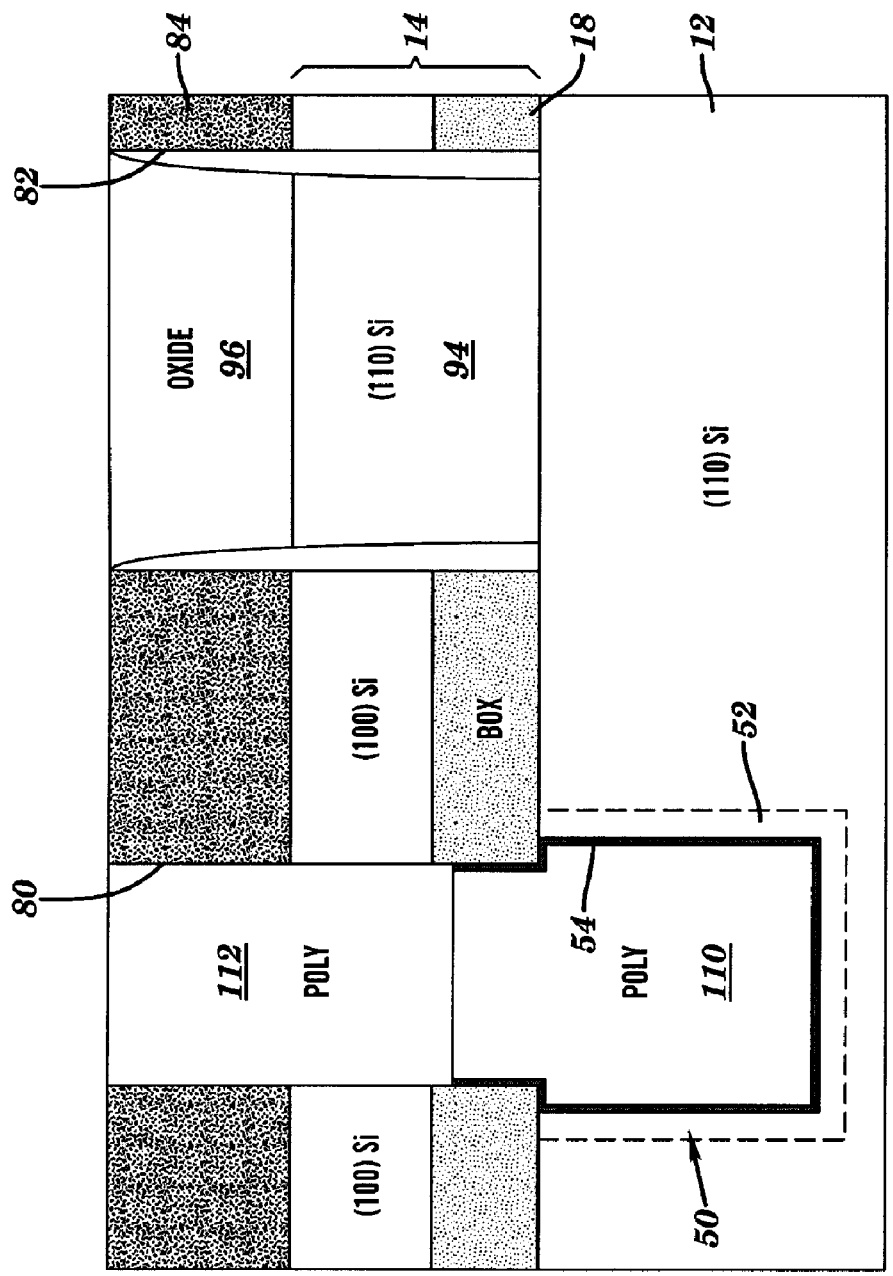

FIGS. 8–9 show the step of forming deep trench capacitor 50 in deep trench 100 (FIG. 7). This step may include, first, depositing a node dielectric 54 in first opening 80 and deep trench 100 (FIG. 7), as shown in FIG. 8. As also shown in FIG. 8, the second part includes filling first opening 80 and deep trench 100 (FIG. 7) with a doped node polysilicon 110, e.g., an As doped polysilicon by LPCVD followed by CMP. Third, as shown in FIG. 9, doped node polysilicon 110 is removed from in first opening 80, e.g., to approximately an upper surface of buried silicon dioxide 18, although this is not necessary. The removal may be, for example, by a dry etch such as $SF_6$ and a feed gas. Node dielectric 54 is then removed from a sidewall of first opening 80 above buried silicon dioxide 18 of SOI region 14 using, for example, a wet or dry isotropic etch such as hydrofluoric acid (HF) and ethylene glycol. As an option at this stage, a sidewall nitridation (not shown) may be formed on the sidewall of first opening 80 to provide an interface, diffusion, re-crystallization barrier. This nitridation may be very thin, e.g., approximately 10 Å. Next, as shown in FIG. 9, first opening 80 is filled with polysilicon 112, e.g., intrinsic or As doped polysilicon using LPCVD, and planarized.

Figure 10:
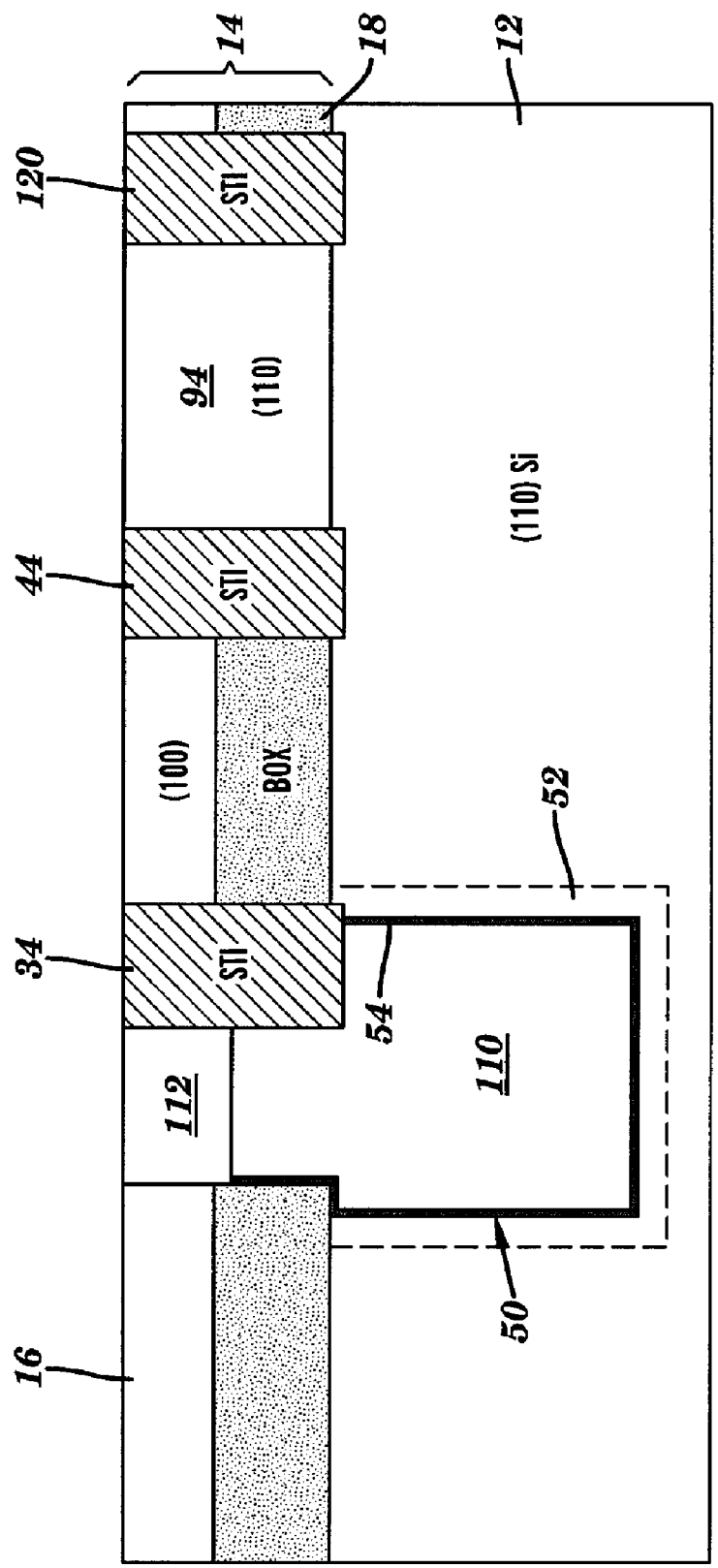

Turning to FIG. 10, the final steps of the method include carrying out conventional processing to prepare for further structures including, for example, recessing polysilicon 94, 112 to be coplanar with silicon 16 of SOI region 14, stripping hard mask 84 (FIG. 9) and dielectric cap 96 (FIG. 9), and depositing a path nitride and stripping. Forming shallow trench isolations 34, 44 (FIG. 1 also) and 120 using photolithography and dry etch is next, followed by forming of logic devices (e.g., nFET 32 and pFET 40 in FIG. 1) and perhaps further memory devices (e.g., nFET array 30 in FIG. 1). Since different surface orientations are exposed, different structure can be placed on different surface orientations. As shown in FIG. 1, NMOS array 30 and nFET 32 are placed on (100) surface orientation of SOI region 14, and pFET 40 is placed on (110) surface orientation of epitaxial silicon region 42. While particular surface orientations and structure have been illustrated, it should be recognized that other configurations are also possible. For example, SOI region 14 could have a (110) surface orientation and substrate 12 could have a (100) surface orientation such that epitaxial silicon region 42 has the (100) surface orientation. In this case, logic NMOS may be built on bulk epitaxial silicon region 42 and PMOS on (110) surface orientation SOI region 14. In another example, other configurations including SOI and bulk with different semiconductor materials such as III–V compounds, and other combinations of crystalline orientations including (111) could be used.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A method of forming a deep trench capacitor memory device and logic devices on a single chip with hybrid surface orientation, the method comprising the steps of:
    providing a bulk silicon substrate having a first surface orientation and a silicon-on-insulator (SOI) region thereon having a second, different surface orientation;
    forming a first and a second opening through the SOI region to the bulk silicon substrate using a hard mask;
    forming a spacer in each opening;
    forming a dielectric capped epitaxially grown silicon in the second opening;
    opening a deep trench into the bulk silicon substrate through the first opening;
    forming the deep trench capacitor in the deep trench;
    forming shallow trench isolations; and
    forming the logic devices.

2. The method of claim 1, wherein the first surface orientation is (110) and the second surface orientation is (100).

3. The method of claim 1, wherein the first and second opening forming step includes using a single mask, patterning and etching.

4. The method of claim 1, wherein the dielectric capped epitaxially grown silicon forming step includes:
    epitaxially growing silicon in each opening such that the epitaxial silicon has the first surface orientation;
    forming a dielectric cap over the epitaxial silicon in each opening; and
    removing the dielectric cap in the first opening to the epitaxial silicon.

5. The method of claim 4, wherein the dielectric cap forming step includes: planarizing and recessing the epitaxial silicon in each opening, depositing the dielectric and then planarizing the dielectric.

6. The method of claim 1, wherein the first opening is less wide than the second opening, and the dielectric capped epitaxially grown silicon forming step includes:
    conformally depositing a first dielectric to substantially fill the first opening and partially fill the second opening;
    removing the first dielectric from the second opening;
    epitaxially growing silicon in the second opening such that the epitaxial silicon has the first surface orientation;
    forming a second dielectric cap over the epitaxial silicon in the second opening; and
    removing the first dielectric from the first opening.

7. The method of claim 1, further comprising the steps of:
    widening the deep trench in the bulk silicon region and below the SOI region; and
    forming a buried plate in the widened deep trench.

8. The method of claim 1, wherein the trench capacitor forming step includes:
    depositing a node dielectric in the first opening and the deep trench;
    first filling the first opening and the deep trench with a doped node polysilicon;
    recessing the doped node polysilicon in the first opening;
    removing the node dielectric from a sidewall of the first opening above a buried oxide of the SOI region;
    second filling the first opening with polysilicon and planarizing.

9. The method of claim 8, further comprising forming a sidewall nitridation on the sidewall of the first opening prior to the second filling step.

10. A method of preparing a substrate for forming a deep trench capacitor memory device and logic devices on a single chip with hybrid surface orientation, the method comprising the steps of:
    providing a bulk silicon substrate having a first surface orientation and a silicon-on-insulator (SOI) region thereon having a second, different surface orientation;
    using a single hard mask for forming:
        a first opening through the SOI region to be used for fabricating the deep trench capacitor, and
        a second opening through the SOI region to the bulk silicon substrate for fabricating a first type logic device on the first surface orientation.

11. The method of claim 10, wherein the dielectric capped epitaxially grown silicon forming step includes:
    epitaxially growing silicon in each opening such that the epitaxial silicon has the first surface orientation;
    forming a dielectric cap over the epitaxial silicon in each opening; and
    removing the dielectric cap in the first opening to the epitaxial silicon.

12. The method of claim 11, wherein the dielectric cap forming step includes: planarizing and recessing the epitaxial silicon in each opening, depositing the dielectric and then planarizing the dielectric.

13. The method of claim 10, wherein the first opening is less wide than the second opening, and the dielectric capped epitaxially grown silicon forming step includes:

conformally depositing a first dielectric to substantially fill the first opening and partially fill the second opening;

removing the first dielectric from the second opening;

epitaxially growing silicon in the second opening such that the epitaxial silicon has the first surface orientation;

forming a second dielectric cap over the epitaxial silicon in the second opening; and removing the first dielectric from the first opening.

14. The method of claim 10, further comprising the steps of:

widening the deep trench in the bulk silicon region and below the SOI region; and forming a buried plate in the widened deep trench.

15. The method of claim 10, wherein the first surface orientation is (110) and the second surface orientation is (100).

* * * * *